(12) United States Patent
Hurrell et al.

(10) Patent No.: US 7,936,297 B2
(45) Date of Patent: May 3, 2011

(54) ANALOG TO DIGITAL CONVERTER

(75) Inventors: Christopher Peter Hurrell, Berkshire (GB); Colin G Lyden, Baltimore (IE); Ronald A. Kapusta, Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/534,392

(22) Filed: Aug. 3, 2009

(65) Prior Publication Data

US 2010/0176979 A1   Jul. 15, 2010

Related U.S. Application Data

(63) Continuation-in-part of application No. 12/255,359, filed on Oct. 21, 2008.

(51) Int. Cl.
*H03M 1/12* (2006.01)
(52) U.S. Cl. ............... 341/155; 341/161; 341/156
(58) Field of Classification Search .......... 341/155, 341/161, 156
See application file for complete search history.

(56) References Cited

U.S. PATENT DOCUMENTS

| 7,030,804 B2* | 4/2006 | Yoshioka et al. ............ 341/172 |
| 7,271,750 B1 | 9/2007 | Ali |
| 7,321,245 B2* | 1/2008 | Tani et al. ............ 327/109 |
| 2004/0077326 A1 | 4/2004 | Shi |
| 2007/0008282 A1* | 1/2007 | Ogita et al. ............ 345/161 |
| 2007/0285296 A1 | 12/2007 | Bilhan |
| 2009/0128385 A1 | 5/2009 | Joshi et al. |

OTHER PUBLICATIONS

PCT International Search Report and Written Opinion for PCT/US2010/42242 mailed on Sep. 1, 2010.

* cited by examiner

*Primary Examiner* — Jean B Jeanglaude
(74) *Attorney, Agent, or Firm* — Kenyon & Kenyon LLP

(57) ABSTRACT

An analog to digital converter comprising an Nth analog to digital converter and an N+1th analog to digital converter arranged in series such that a residue signal from the Nth analog to digital converter is provided as an input to the N+1th analog to digital converter, characterized in that a bandwidth control means is provided in a signal path for the residue signal and the bandwidth control means is controlled so as to have a first bandwidth during a first period following generation of a conversion result from the Nth analog to digital converter, and a second bandwidth less than the first bandwidth in a second period following the first period.

14 Claims, 7 Drawing Sheets

ANALOG TO DIGITAL CONVERTER

PRIORITY CLAIM

This is a continuation in part of application Ser. No. 12/255,359, entitled "Apparatus for and Method of Performing an Analog to Digital Conversion" filed Oct. 21, 2008, the contents of which are incorporated herein by reference in its entirety.

FIELD OF THE INVENTION

The present invention relates to an analog to digital converter in which the converter task is shared between conversion units.

BACKGROUND OF THE INVENTION

Analog to digital converters often have to trade off speed against resolution and noise performance. However users of such converters often want fast conversions, which is in opposition with good noise performance.

SUMMARY OF THE INVENTION

According to a first aspect of the present invention there is provided an analog to digital converter comprising an Nth analog to digital converter and an N+1th analog to digital converter arranged in series such that a residue signal from the Nth analog to digital converter is provided as an input to the N+1th analog to digital converter, characterised in that bandwidth control means is provided in a signal path for the residue signal and the bandwidth control means is controlled so as to have a first bandwidth during a first period following generation of a conversion result from the Nth analog to digital converter, and a second bandwidth less than the first bandwidth in a second period following the first period.

It is thus possible to allow the input to the N+1th analog to digital converter approach a correct value quickly during the first period, but then to reduce the bandwidth so as to reduce noise power in the N+1th analog to digital converter during a second period when the N+1th analog to digital converter forms a conversion result.

Preferably the bandwidth control means is a variable bandwidth filter. The variable bandwidth filter may be formed in the analog or digital domains.

Preferably the first period is a predetermined period, for example its duration is known or is programmable, which starts at the end of conversion of the Nth analog to digital converter, and which allows a residue signal from the Nth analog to digital converter to be provided to the N+1th converter, optionally after being amplified. Where amplification is provided, the first period is selected so as to allow the output signal of the amplifier to substantially reach a "settled" value.

In a preferred embodiment of the present invention there is provided an analog to digital converter comprising an Nth and N+1th analog to digital converter, wherein an amplifier is provided between the Nth and the N+1th analog to digital converters for forming an amplified residue signal, and where the amplifier or a low pass filter in series with the amplifier has a first bandwidth during a settling period and after the settling period the bandwidth of the amplifier or filter is reduced during an analog to digital conversion process, which may include the sampling or acquisition process, of the N+1th analog to digital converter.

The reduction of the effective bandwidth may be performed via a plurality of techniques which may involve modification of the amplifier's characteristics, the inclusion of an intermediate network between the amplifier and the analog to digital converter or modification of the N+1th analog to digital converter's operation.

Preferably a low pass filter response is provided by changing a time constant of a resistor-capacitor, RC, network within the amplifier, at an output of an amplifier or at an input to the N+1th analog to digital converter.

Where, for example, the amplifier drives an RC low pass filter a switch, for example in the form of a transistor, may be placed in parallel with the resistive component R of the RC load so as to selectively shunt all or part of it. Thus, during a settling period the resistive element could be shunted out so as to provide a filter network having a high bandwidth, and after a short settling period the shunt can be removed such that the bandwidth of the filter is much reduced, and hence the noise power delivered to the N+1th analog to digital converter is reduced.

Alternatively where the amplifier is in a feedback network such that the feedback network defines the gain of the amplifier, then the internal gain of the amplifier within the feedback network can be reduced. The DC gain of the amplifier and feedback network combination remains substantially unchanged because the DC gain is defined by the feedback network but the bandwidth of the combination can be significantly reduced by reducing the amplifier gain.

In a further alternative arrangement a network of capacitors may be provided to sample the signal at the output of the amplifier at a plurality of instants so as to provide over sampling of the residue signal. This allows for the creation of a digital filter. Advantageously the capacitors are initially connected to the amplifier output together such that they precharge together during the settling period. After the end of a time allowed for the settling period the capacitors can be sequentially disconnected such that each disconnection event effectively makes its own sample of the amplifier output. The individual samples can then be presented as an input or inputs to the N+1th analog to digital converter.

At each disconnection event the sample value due to the input signal can be assumed to be relatively constant whereas the noise at the disconnection event is different from, and can be regarded as being substantially uncorrelated with, the noise from any proceeding or succeeding disconnection event. Thus averaging of the signals sampled onto the capacitors will give an improvement in the signal to noise ratio of the signal presented to the N+1th analog to digital converter. Interestingly it should be noted that it is not necessary for all of the sampling events to have been completed before the signals are provided to the N+1th analog to digital converter. Given that each of the sample values should be similar to the other sample values then there is sufficient information after the first sampling event to start the analog to digital conversion. The signals from the second and subsequent sampling events can then be averaged with that from the first sampling event as the analog to digital conversion progresses. There is a risk that the subsequently sampled signals may cause a decision response to the first sample to be subsequently deemed to be incorrect, but provided the converter has some redundancy therein it can recover from such an incorrect decision.

As a further alternative the N+1th analog to digital converter may be operated to over sample the signal at the output of the amplifier. Each sampling instant includes both a signal component which is correlated with the signal components of the other sampling instants and a noise component which is largely uncorrelated with the noise of the other sampling instants. Thus summing or averaging the values derived from the analog to digital converter as a result of the over sampling gives rise to an improvement in the signal to noise ratio. Thus the low pass filter is not provided as an explicit filter component but is instead synthesised by the N+1th converter.

Preferably the amplifier is a residue amplifier forming an amplified residue which represents a difference between an input signal to the Nth analog to digital converter and the analog value of the conversion result of the Nth analog to digital converter. Thus the residue can be expected to be approximately 1 least significant bit value of the Nth analog to digital converter.

The Nth and N+1th analog to digital converters need not necessarily be of the same converter technology although frequently they will be. Thus the converters may be flash converters, successive approximation routine converters or sigma delta converters. Other analog to digital converter technologies such as dual ramp converters and voltage to frequency converters could also be used.

According to a second aspect of the present invention there is provided a method of operating an analog to digital converter which comprises a Nth analog to digital converter, an N+1th analog to digital converter and a filter in a signal path from the Nth converter to the N+1th converter for filtering a residue signal from the Nth converter, the method comprising using the Nth converter to form a first part of a conversion result and a residue signal, passing the residue signal to the N+1th converter to form a second part of the conversion result, and controlling the filter such that it has a first bandwidth for a first period of time following formation of the residue signal and a second bandwidth less than the first bandwidth when the N+1th converter is operating to form the second part of the conversion result.

BRIEF DESCRIPTION OF THE DRAWINGS

The present invention will further be described, by way of non-limiting example only, with reference to the accompanying drawings, in which.

DESCRIPTION OF PREFERRED
EMBODIMENTS OF THE INVENTION

Figure 1:
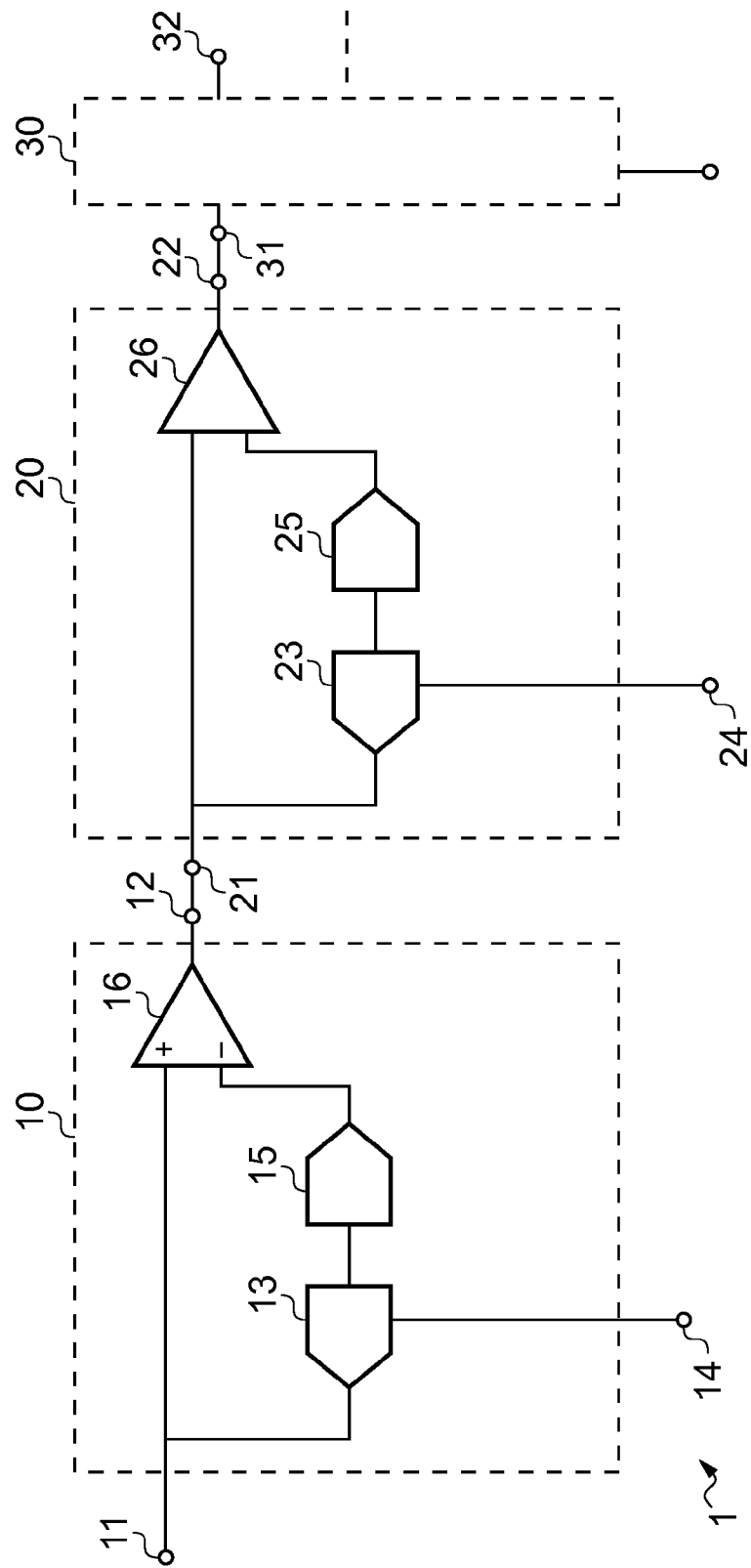
FIG. 1 schematically illustrates an analog to digital converter comprising a plurality of conversion stages and constituting an embodiment of the present invention.

It is known that individual analog to digital converter stages may be connected in series such that each stage works to perform part of an analog to digital conversion. Such an arrangement is shown in FIG. 1. Here a pipeline analog to digital converter, generally indicated 1, comprises M stages, namely a first stage 10, a second stage 20, a third stage 30 and so on. If each stage only determines a single bit then there may be typically between 12 and 16 stages. However if each stage determines four bits of a conversion result then there might only be three or four stages. For simplicity only the first three stages are shown. Each stage comprises an input, 11, 21, 31 and so on. Each stage except the last, also has an analog output 12, 22, 32 and so on. The internal configuration of each stage, except possibly the last stage which need not form a residue signal is identical and for simplicity only the configuration of the first stage will be described in detail. A signal at the input 11 is provided to an input of a first stage analog to digital converter 13. The analog to digital converter can be regarded as being a relatively coarse converter having say only between 1 and 4 bits of resolution. The analog to digital converter within this stage can be of any suitable technology, such as switched capacitor successive approximation converter technology, flash converter and so on. Within the first stage 10 the first stage analog to digital converter 13 is allowed to operate so as to obtain a conversion result which it outputs at a first stage output 14. The first stage analog to digital converter 13 also passes its result to a first stage digital to analog converter 15 which generates an analog signal representative of the digital result obtained by the first stage analog to digital converter 13. The first stage also includes a circuit for forming a difference between the signal at the input 11 and the conversion result output by the digital to analog converter 15. This could be in the form of a summing circuit or, as shown here, might be achieved by presenting the input signal to the non-inverting input of a differential amplifier and the digital to analog converter output 15 to the inverting input of the differential amplifier 16. The first stage differential amplifier 16 forms the difference between the input signal and the converted signal result, applies a first stage gain to it and outputs the result at its output 12. This signal can be regarded as a gained up "residue" which is a signal that represents the difference between the input value and the converted value. This difference, after amplification, is then passed to the second stage where the process is repeated again.

Although the analog to digital converter 13, the digital to analog converter 15 and the difference circuit have been shown as separate components it should be appreciated that in some analog to digital converter technologies, such as switched capacitor arrays, the capacitors of the array can be used both to sample the input signal and then, during each of the bit trials, the value output by the switched capacitor array represents a residue between the analog value of the digital word being trialled and the input signal. Thus, if the analog to digital converter 13 is a four bit switched capacitor array successive approximation routine, SAR, converter then after it has completed four bit trials the result output to its comparator (not shown) represents the residue and then this value can then merely be gained up by amplifier 16 before being passed on to the subsequent stage.

In general users of such converters want them to be able to convert quickly. However once the conversion result has been passed to the digital to analog converter 15 (or the final bit trial within a SAR conversion has been accepted) the residue amplifier 16, 26 and so on must take this value and apply gain in order to achieve its correct output. This will inherently involve charging and discharging of capacitances within the amplifier, whether they be gate capacitances, parasitic capacitances or deliberately introduced capacitances such as compensation capacitors which are provided to ensure amplifier stability. These capacitances may be charged or discharged via current sources, current mirrors, and/or resistive networks. This means that the evolution with respect to time of the amplifier output voltage may be non-linear as various limiting effects come into play or fall out of play. Furthermore, while this is proceeding, the effect of switching capacitors within the first stage analog to digital converter 13 may give rise to small supply line transients within the analog to digital converter chip. As a consequence some time, generally called a "settling time", needs to be allowed between defining the first stage conversion result and being confident that the value of the signal at the first stage output 12 has evolved to its correct value. For simplicity the amplifier 16 is often regarded as a high bandwidth amplifier in combination with a simple RC filter, for example a Butterworth low pass filter, such that the evolution of the output voltage with respect to time can be regarded as being represented by a resistor capacitor time constant $\tau$.

There is an engineering "rule of thumb" or prejudice that a period of ten times the time constant $\tau$ should be allowed to pass before the output of the amplifier has settled sufficiently for it to be of use, certainly within the high resolution, e.g. 14 or more, bit converters. Shorter settling periods can be used when lower resolution is acceptable Waiting for ten time constants places a natural delay in the conversion process. This however is in contrast with the general desire for the converter to operate at speed and for unnecessary delays to be eliminated. For this reason the residue amplifiers 16, 26 and so on are designed to be high bandwidth so that their settling time is as short as possible, within technology and power budget constraints.

Figure 2:
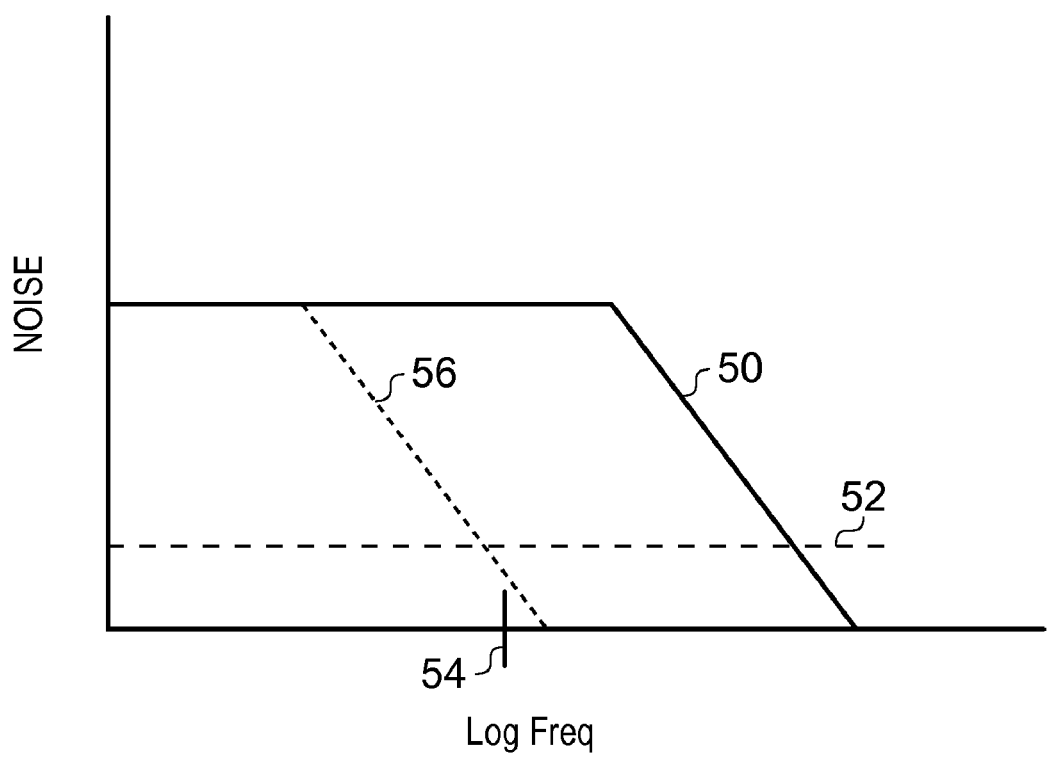
FIG. 2 schematically illustrates noise spectra.

This in itself gives rise to other performance problems. FIG. 2 schematically illustrates a noise versus frequency spectrum for various components. As noted before the amplifier is regarded as being a high bandwidth device in combination with a low pass filter and hence its response can to a first order approximation be represented by line 50. Noise of the input of the analog to digital converter may be from a resistive sensor and hence may be generally white, as represented by line 52.

As each stage passes its signal to a subsequent stage the effect is that the signals at an input stage become sampled. This sampling occurs at a "sampling rate". When viewed in the frequency domain such discreet sampling can cause frequencies above the sampling rate to be folded over and reflected back into the bandwidth below the sampling rate. The prior art desire to have the residue amplifier settle as quickly as possible inevitably means that their bandwidth exceeds the sampling rate and hence noise above the sampling rate frequency is folded back into the base band. This is schematically represented by sampling at the sampling rate designated by vertical line 54. If however the bandwidth of the amplifier was less, such that its frequency response was represented by the chain line 56 having a break point below the sampling frequency then there would be much reduced noise above the sampling frequency and this would not be folded back into the baseband. Hitherto within the context of analog to digital converters having this reduced frequency would be at the expense of a longer RC time constant and hence a longer settling time.

Figure 3:
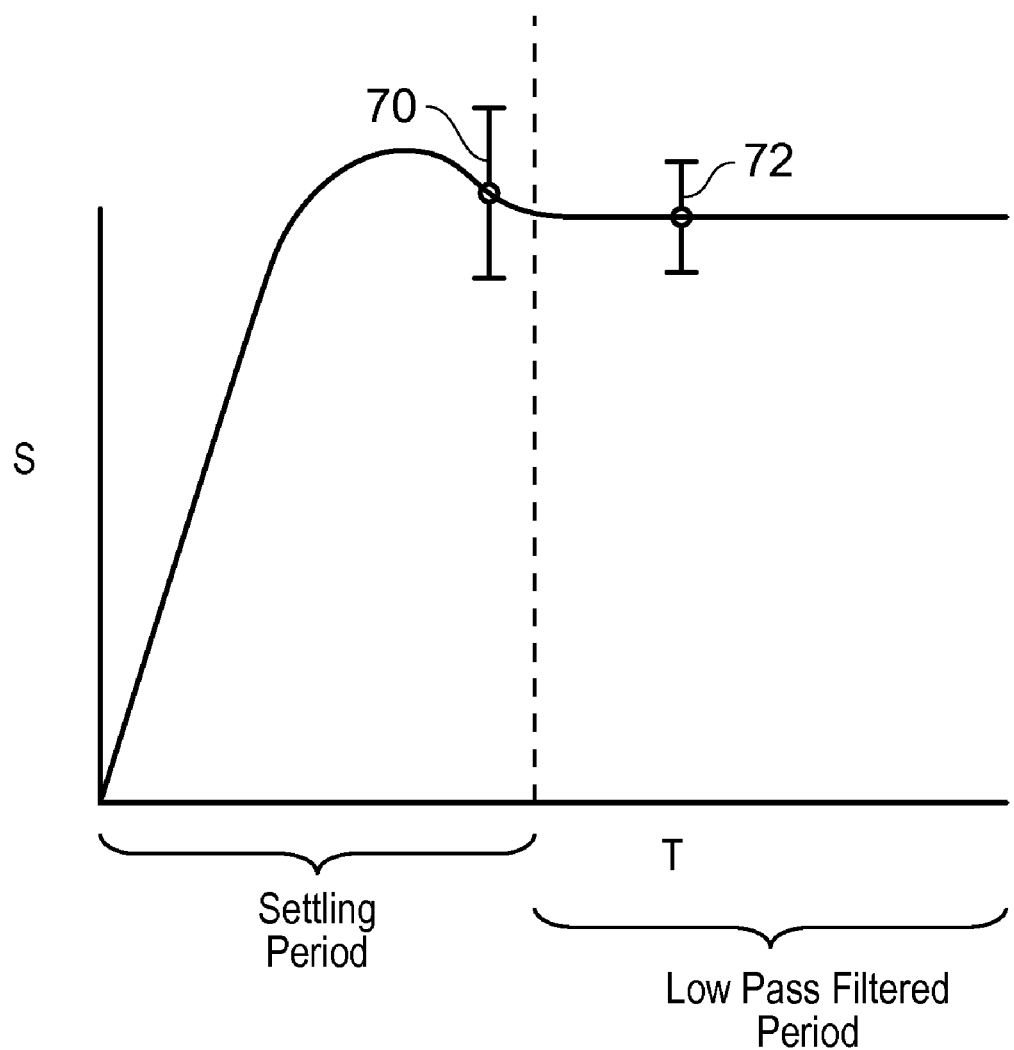
FIG. 3 illustrates the evolution with time of the output of a residue amplifier following determination of a bit trial in an analog to digital converter stage.

The inventors have realised that it would be possible to change the bandwidth of the residue amplifier. FIG. 3 schematically represents the evolution of a voltage, S, at the output of the residue amplifier 16 with respect to time. During a first period, which can be regarded as a settling period, the amplifier can be operated in high bandwidth mode such that its output S tends towards it final or settled value as quickly as possible. Operating in a high bandwidth mode means that more noise power is allowed to propagate to the amplifier output and the voltage variation in the output as a result of the noise power is represented by the vertical line 70. After the end of the settling period, which can be timed out by a monostable or similar circuit, the bandwidth of the residue amplifier can be reduced. The reduction in bandwidth makes very little difference to the signal output value, but does reduce the noise power in the output signal and hence reduces the instantaneous voltage fluctuations to a reduced range designated by line 72. In this low pass filtered/bandwidth reduced mode the signal and noise is passed from an Nth stage of the analog to digital converter to an Nth+1th stage, for example from the first stage to the second stage. However by changing the bandwidth during this process the signal to noise ratio can be improved.

Figure 4:
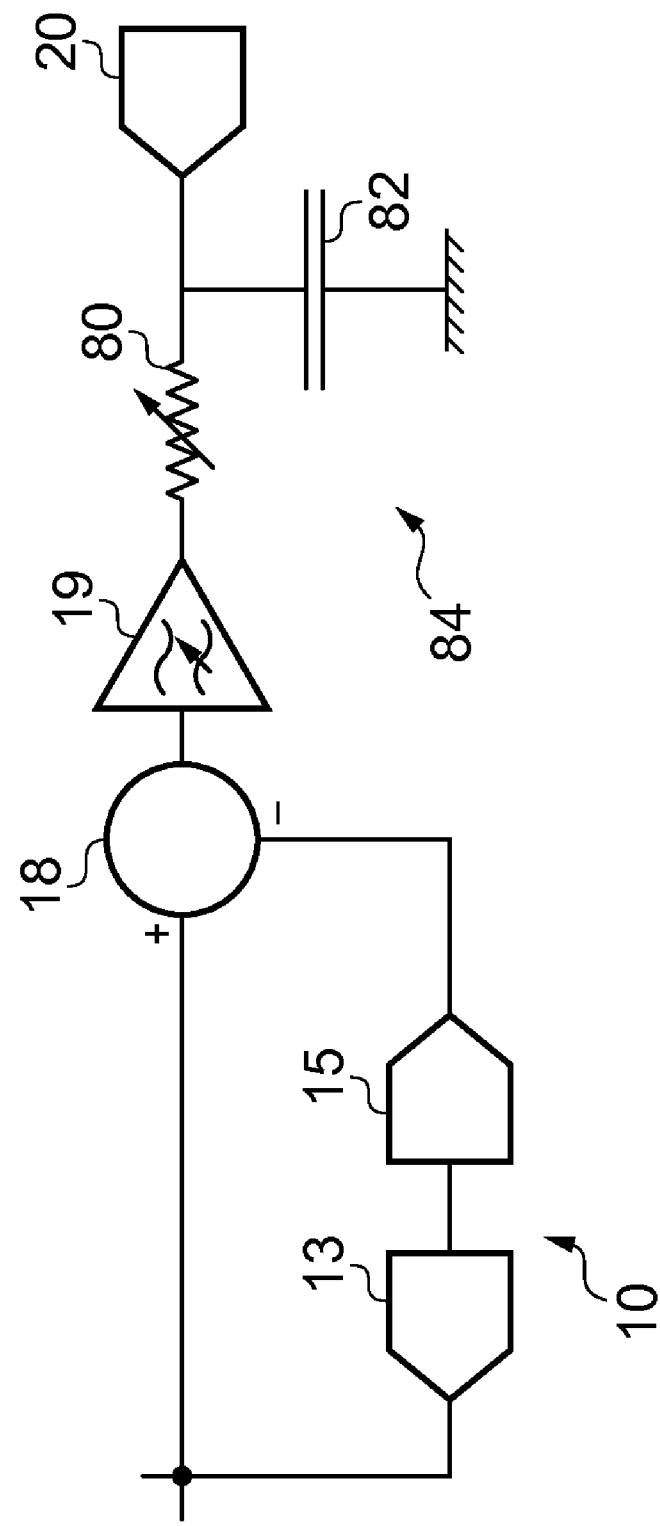
FIG. 4 illustrates a bandwidth limiting circuit constituting an embodiment of the present invention.

FIG. 4 shows a converter stage, for example the first stage 10 in greater detail with the second stage 20 being represented as an analog to digital converter. In this representation a summer 18 is provided to form the difference between the input signal $V_{in}$ and the output of the first stage digital to analog converter 15. The output of the summer is provided to an amplifier 19. The amplifier 19 may have a variable bandwidth or, as shown, the amplifier 19 might drive a filter stage comprising a resistor 80 and a capacitor 82. The resistor 80 is variable such that the time constant of the filter stage 84 formed by the resistor 80 and capacitor 82 can be varied. Thus, during the settling period the resistor 80 can have a low value whereas in the low pass filtered period the resistor 80 can have a higher value.

Figure 5:
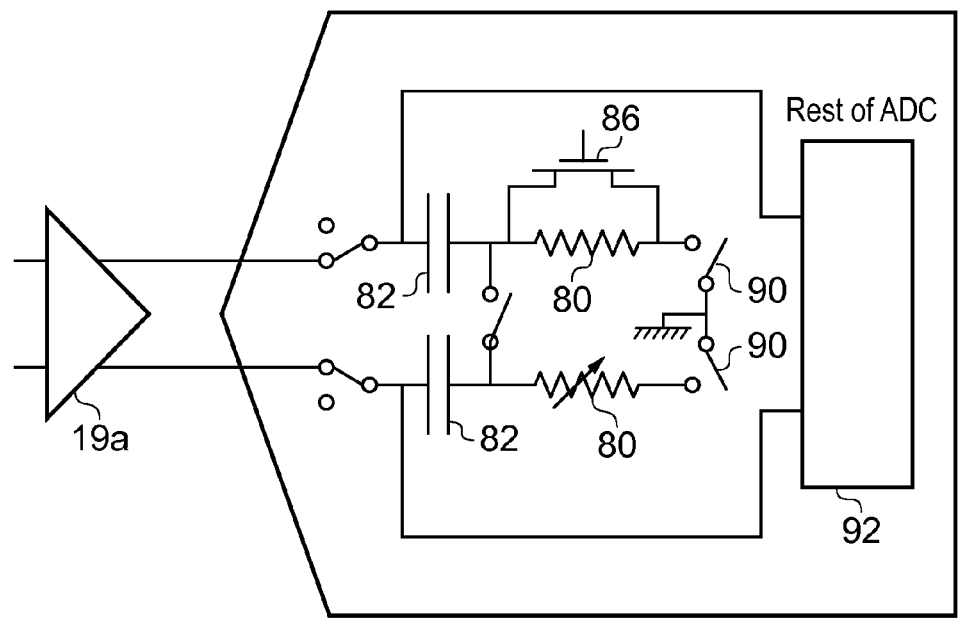
FIG. 5 schematically illustrates a similar bandwidth circuit to that shown in FIG. 4 when used in a differential configuration.

FIG. 5 shows an alternative embodiment of the invention where a dual ended amplifier 19a provides an input to a dual ended analog to digital converter 20a. In the dual ended arrangement the capacitor 82 and resistor 80 of the filter 84 can in fact be placed in series. The resistor 80 is, as before, variable and this can be achieved by placing a transistor 86 in parallel with the resistor 80 such that the resistor can be selectively shunted in order to effectively remove it from the circuit so as to change the bandwidth thereof. The components of the filter can also be used as part of the sampling network of the analog the digital converter. In such an arrangement sampling switches 90 are provided to cooperate with the transistor 86 to short one plate of the capacitor to ground during a sampling phase. The rest of the analog to digital converter is schematically represented as item 92.

Figure 6:
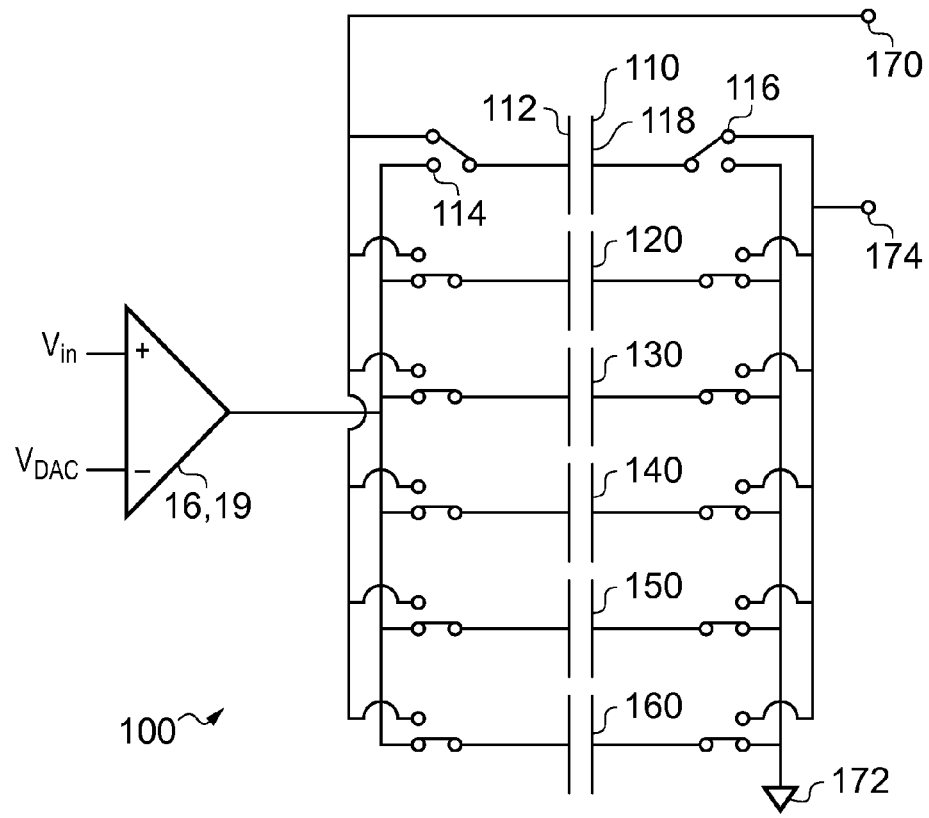
FIG. 6 schematically illustrates an array of capacitors for taking multiple samples in time of the residue signal, and allowing them to be combined thereby forming a finite impulse response low pass filter constituting an embodiment of the present invention.

FIG. 6 shows a further arrangement for obtaining a low pass filter response. In FIG. 6 the output of the amplifier 16 or 19 is connected to an array 100 of capacitors 110, 120, 130, 140, 150 and 160. Greater or less than 6 capacitors can be used. Each capacitor is associated with switches such that, considering the first capacitor 110 as an example, a first plate 112 of the capacitor can either be connected to an output of the amplifier 16 or to a first output 170 of the array. This is achieved via a switch 114 which in reality is formed by two transistors. A second switch 116 may be provided such that a second plate 118 of the capacitor can either be connected to a bias voltage 172 during sampling of the signal onto the capacitors or optionally to a further output 174, however the second switches may be omitted if the second plate 118 is always going to be held at the same potential.

In use during the settling phase all of the capacitors are connected to the output of the amplifier 16. Once settling is deemed to have occurred each capacitor is selectively disconnected, in turn, from the amplifier output such that it samples and stores the instantaneous voltage at the amplifier output. All of the capacitors can either be completely disconnected during this phase or each one can be connected to the output 170 whilst other ones of the capacitors still remain connected to the amplifier 16. As each subsequent capacitor is disconnected from the amplifier and reconnected to the output 170 the instantaneous voltages on the capacitors combine with one another due to charge redistribution. This, in effect, forms an average of samples taken at differing points in time. The person skilled in the art will realise from Z domain analysis that this represents a low pass filter function, and in this instance is a finite impulse response low pass filter. Thus a low pass response has been achieved through use of the switching circuit 100 rather than varying the parameters of the amplifier 16 or 19. In the arrangement shown in FIG. 6 the capacitors are connected to the output 170 in parallel. If, however, the switching arrangement was modified such that once all the capacitors had been charged, they were then connected in series, then the capacitors would provide a voltage gain (i.e. time 6 gain in this example) to the signal whilst still averaging out the noise.

The circuit can also work in a way where both terminals of any given capacitor are switched to the outputs 170 and 174, respectively. In this arrangement either of the outputs can be connected to a reference, such as ground, and the other can act as an output terminal.

The capacitors are preferably equally weighted such that the circuit forms a simple average. However in other variations the capacitors need not be equal, such that their contributions sum to form a weighted average.

Figure 7:
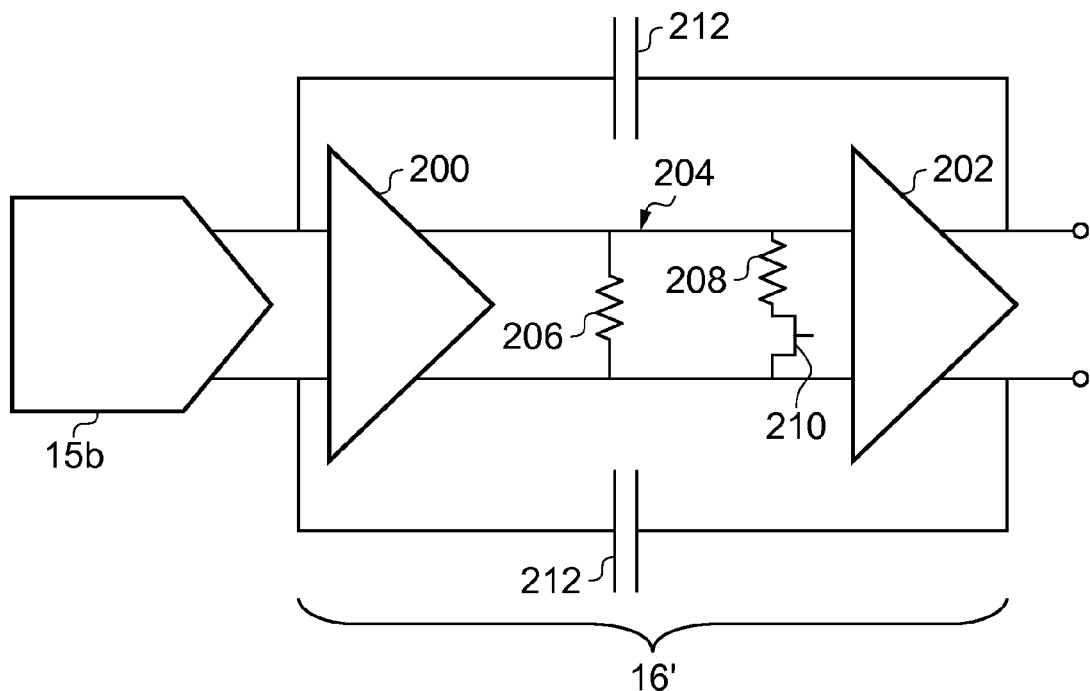
FIG. 7 illustrates a residue amplifier where the gain thereof is defined by a feedback network, and where the bandwidth can be modified by altering the gain of an amplifier block within the feedback network.

FIG. 7 shows a further embodiment of the invention in which a dual ended successive approximation converter using switched capacitor technology drives the residue amplifier 16'. The converter 15b forms a residue directly as part of its conversion process so the amplifier 16' only needs to add gain. The amplifier 16' comprises a first stage which is a transconductance amplifier 200 such that a voltage at its inputs is converted to a current at its output. The amplifier 200 is followed by a further amplifier stage 202. The voltage difference occurring between the inputs of the amplifier stage 202 can be varied by controlling the value of a resistive network 204 that extends between the output of the differential amplifier 200. As shown the network 204 comprises a first resistor 206 which always extends between the outputs of the amplifier 200 and a second resistor 208 in series with the transistor 210 such that current flow through the resistor 208 can be inhibited or allowed, as appropriate, depending on the switching state of the transistor 210. Thus the gain of the amplifier can be adjusted between two levels depending on whether transistor 210 is conducting or not. Switching the gain of the amplifier which is formed by the action of the amplifiers 200 and 202 does not actually make any significant difference to the output of amplifier 202 because the gain of the combination is defined by the external feedback network, components 212 rather than by the intrinsic gains of the amplifiers 200 and 202 themselves. However changing the "internal" gain seen by the amplifiers 200 and 202 does vary the bandwidth.

In further implementations where, for example, cascode transistors are provided within amplifiers, a resistive network, or indeed a switch, could be connected between suitable nodes to controllably reduce the bandwidth of the amplifier. Other bandwidth control techniques may include modifying bias currents with in the amplifiers.

Figure 8:
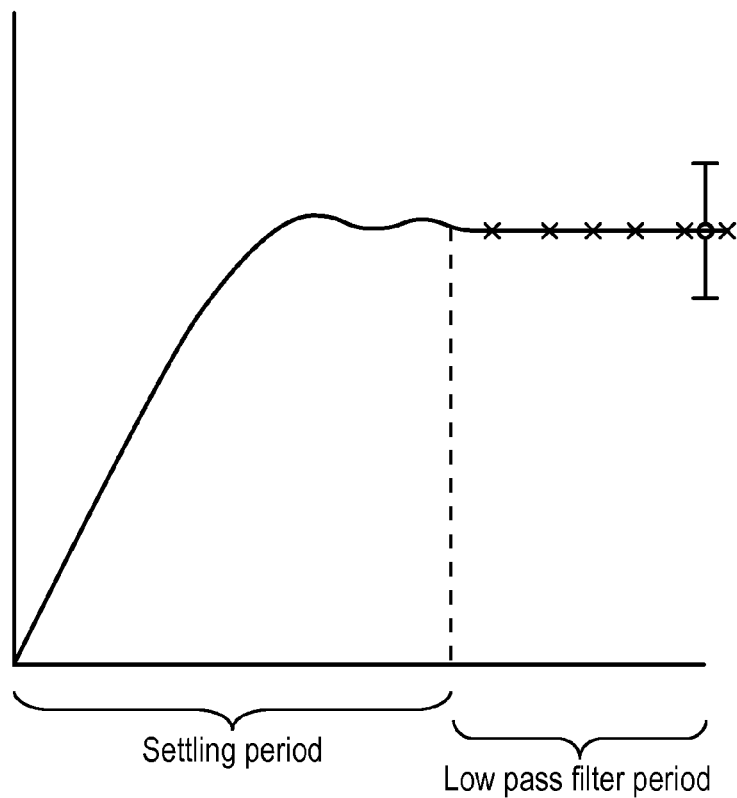
FIG. 8 illustrates the use of over-sampling by the N+1th converter to form a FIR low pass filter.

FIG. 8 schematically illustrates a further embodiment of the invention in which the low pass filtering action is performed by using the N+1th analog to digital converter to over-sample the signal at its input P times (P=6 in this example) and then to average the over-sampled values. This, as in the case of the arrangement shown in FIG. 6, effectively performs a finite impulse response low pass filter due to the averaging of the sample values and hence improves the signal to noise ratio because the noise power is uncorrelated from one sample to the next whereas the signal power is correlated.

Figure 9:
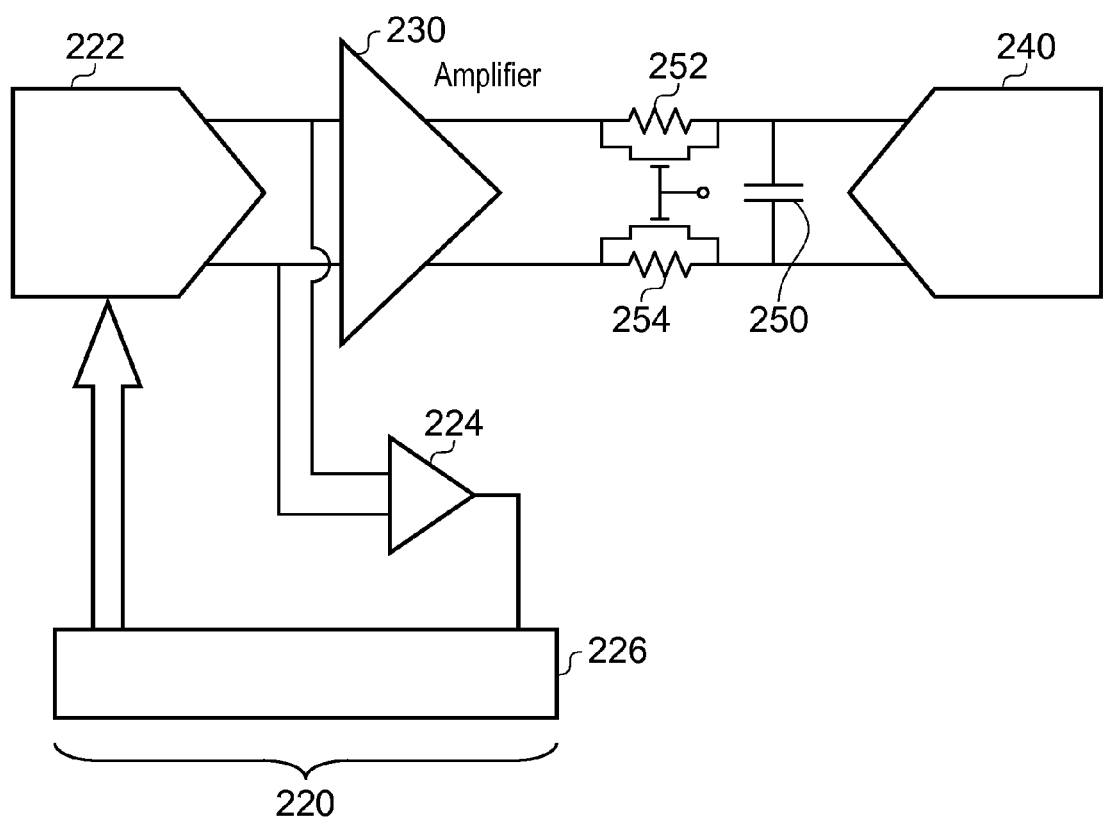
FIG. 9 schematically illustrates a two stage converter in which the first and second stages are implemented as successive approximation routine converters and a bandwidth limiting element is provided in association with a residue amplifier.

FIG. 9 schematically illustrates a further embodiment of the invention in which a successive approximation analog to digital converter stage 220 comprising a digital to analog converter 222, comparator 224 and successive approximation routine controller 226 is used to convert the upper K bits of an L bit output word. If, as shown here, the digital to analog converter 222 is formed by switched capacitor networks, as is well known to the person skilled in the art, then the converter 222 can also act as a sampling capacitor and can also directly output a residue signal to residue amplifier 230 which provides gain to the signal before acting as an input to further analog to digital converter 240. In this differential arrangement the resistor-capacitor network can comprise a single capacitor 250 which bridges the inputs of the differential analog to digital converter 240 in combination with series resistors 252 and 254 each of which can be shunted by respective shunt transistor such that they can effectively be removed from the circuit during the signal settling period and reinserted into the circuit during the low pass filter period.

It is thus possible to modify the operation of a multistage analog to digital converter such that the signal bandwidth presented to a second and succeeding stage can be deliberately reduced during an acquisition phase of the subsequent converter but the bandwidth can be maintained at a higher value during a settling period so as not to impact on the converter throughput/conversion rate.

The invention claimed is:

1. An analog to digital converter comprising an Nth analog to digital converter and an N+1th analog to digital converter arranged in series where a residue signal from the Nth analog to digital converter is provided as an input to the N+1th analog to digital converter, wherein a bandwidth controller is provided in a signal path for the residue signal and has a first bandwidth during a first period following generation of a conversion result from the Nth analog to digital converter, and a second bandwidth less than the first bandwidth in a second period following the first period.

2. An analog to digital converter as claimed in claim 1, in which an amplifier is provided for amplifying the residue signal.

3. An analog to digital converter as claimed in claim 2, in which the bandwidth of the amplifier is controllable.

4. An analog to digital converter as claimed in claim 1, wherein bandwidth controller comprises a resistor-capacitor low pass filter, and a transistor in parallel with the resistor to selectively shunt the resistor.

5. An analog to digital converter as claimed in claim 1, in which the bandwidth controller comprises a finite impulse response low pass filter.

6. An analog to digital converter as claimed in claim 5, comprising a plurality of capacitors arranged to sample, at different instants in time, the residue signal, and a switching arrangement arranged to connect the capacitors together to combine the sampled signals.

7. An analog to digital converter as claimed in claim 6, in which the switching arrangement is adapted to allow capacitors which have sampled the residue signal to be connected to an input of the N+1th analog to digital converter while others of the capacitors are still engaged in taking the samples of the residue signal.

8. An analog to digital converter as claimed in claim 1, in which the N+1th analog to digital converter has redundancy so as to recover from an incorrect bit trial decision.

9. An analog to digital converter as claimed in claim 1, in which the N+1th analog to digital converter is arranged to form a low pass filter by over sampling the residue signal.

10. An analog to digital converter as claimed in claim 9, in which the N+1th analog to digital converter forms a conversion result for each of the over samples, and the conversion results are averaged.

11. An analog to digital converter as claimed in claim 1, in which the Nth and N+1th analog to digital converters are selected from flash converters, successive approximation routine converters, sampled data sigma-delta converters, continuous time sigma-delta converters, dual ramp converters and voltage frequency converters.

12. A method of operating an analog to digital converter which comprises an Nth analog to digital converter, an N+1th analog to digital converter and a filter in a signal path from the Nth converter to the N+1th converter for filtering a residue signal from the Nth converter, the method comprising using the Nth converter to form a first part of a conversion result and a residue signal, passing the residue signal to the N+1th converter to form a second part of the conversion result, and controlling the filter such that it has a first bandwidth for a first period of time following formation of the residue signal and a second bandwidth less than the first bandwidth when the N+1th converter is operating to form the second part of the conversion result.

13. A method as claimed in claim 12, in which the N+1th converter is arranged to take P samples of the first conversion result, and to average them.

14. A method as claimed in claim 12, in which the residue signal is amplified by an amplifier, and the first period is selected to allow an output of the amplifier to settle.

* * * * *